(12) United States Patent
Yun et al.

(10) Patent No.: US 10,341,585 B2
(45) Date of Patent: Jul. 2, 2019

(54) ELECTRONIC DEVICE

(71) Applicant: Samsung Electronics Co., Ltd., Suwon-si, Gyeonggi-do (KR)

(72) Inventors: Sung Young Yun, Suwon-si (KR); Gae Hwang Lee, Seongnam-si (KR); Dong-Seok Leem, Hwaseong-si (KR); Yong Wan Jin, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 304 days.

(21) Appl. No.: 15/183,857

(22) Filed: Jun. 16, 2016

(65) Prior Publication Data

US 2017/0094198 A1    Mar. 30, 2017

(30) Foreign Application Priority Data

Sep. 30, 2015  (KR) .................... 10-2015-0137742

(51) Int. Cl.
| | |
|---|---|
| *H04N 5/33* | (2006.01) |
| *H04N 5/225* | (2006.01) |
| *G03B 11/00* | (2006.01) |
| *H04N 5/232* | (2006.01) |
| *H04N 5/238* | (2006.01) |
| *H04N 9/097* | (2006.01) |
| *G03B 13/36* | (2006.01) |

(Continued)

(52) U.S. Cl.
CPC ............ *H04N 5/332* (2013.01); *G02B 5/208* (2013.01); *G03B 11/00* (2013.01); *G03B 13/36* (2013.01); *H01L 27/307* (2013.01); *H04N 5/2258* (2013.01); *H04N 5/238* (2013.01); *H04N 5/23212* (2013.01); *H04N 9/097* (2013.01)

(58) Field of Classification Search
CPC ........................................................ H04N 5/33
See application file for complete search history.

(56) References Cited

U.S. PATENT DOCUMENTS

| | | | | |
|---|---|---|---|---|
| 4,632,532 A | * | 12/1986 | Matsumura | ............ G02B 7/343 |
| | | | | 396/106 |
| 4,843,227 A | * | 6/1989 | Matsui | .................. G02B 7/285 |
| | | | | 250/201.2 |

(Continued)

FOREIGN PATENT DOCUMENTS

| | | |
|---|---|---|
| KR | 2014-0147376 A | 12/2014 |
| WO | WO-2011/101036 A1 | 8/2011 |
| WO | WO-2014-204111 A1 | 12/2014 |

OTHER PUBLICATIONS

Extended European Search Report dated Jan. 27, 2017 issued in corresponding European Patent Application No. 16191155.7.
Sensors 2015, 15(1), 995-1007; doi:10.3390/s150100995.

*Primary Examiner* — Paulos M Natnael
(74) *Attorney, Agent, or Firm* — Harness, Dickey & Pierce, P.L.C.

(57) ABSTRACT

An electronic device includes a lens, an optical filter asymmetric to an optical axis of the lens, and an image sensor including a visible light image sensor and a non-visible light image sensor. The optical filter has an opening and is configured to transmit visible light and block at least one type of non-visible light. The visible light image sensor is configured to sense the visible light and the non-visible light image sensor is configured to sense the at least one type of non-visible light.

19 Claims, 10 Drawing Sheets

(51) Int. Cl.
    *G02B 5/20*        (2006.01)
    *H01L 27/30*       (2006.01)

(56)            References Cited

U.S. PATENT DOCUMENTS

| | | | |
|---|---|---|---|
| 5,724,152 A * | 3/1998 | Hayashi | G07D 7/12 |
| | | | 347/241 |
| 6,580,459 B2 * | 6/2003 | Uchino | H04N 5/2254 |
| | | | 348/342 |
| 2002/0030755 A1 * | 3/2002 | Uchino | H04N 5/2254 |
| | | | 348/342 |
| 2003/0142406 A1 * | 7/2003 | Robins | G01J 3/26 |
| | | | 359/579 |
| 2005/0052755 A1 | 3/2005 | Lawson et al. | |
| 2006/0274431 A1 | 12/2006 | Wood et al. | |
| 2008/0049982 A1 * | 2/2008 | Nagasaka | G06K 9/00 |
| | | | 382/115 |
| 2008/0278572 A1 | 11/2008 | Gharib et al. | |
| 2008/0308712 A1 | 12/2008 | Ono | |
| 2011/0193942 A1 | 8/2011 | Gharib et al. | |
| 2012/0242857 A1 * | 9/2012 | Mather | G02B 5/005 |
| | | | 348/222.1 |
| 2012/0314085 A1 * | 12/2012 | Gohshi | H04N 5/913 |
| | | | 348/164 |
| 2013/0033578 A1 | 2/2013 | Wajs | |
| 2014/0307059 A1 | 10/2014 | Haddad et al. | |
| 2015/0162548 A1 | 6/2015 | Lim et al. | |
| 2017/0000394 A1 * | 1/2017 | Al-Ali | A61B 5/7278 |

\* cited by examiner

ELECTRONIC DEVICE

CROSS REFERENCE TO RELATED APPLICATION

This application claims priority to and the benefit of Korean Patent Application No. 10-2015-0137742, filed in the Korean Intellectual Property Office, on Sep. 30, 2015, the entire contents of which are incorporated herein by reference.

BACKGROUND

1. Field

Example embodiments relate to an electronic device.

2. Description of the Related Art

An image device including an image sensor configured to store an image as an electric signal, for example, a digital camera or a camcorder, has been widely used.

On the other hand, as technology of increasing resolution and accuracy has been developed, this image device may produce a blurry image focus due to fine motion of an object or the image device itself while taking a photograph, and accordingly, various auto-focusing technologies have been researched to solve this problem.

However, the auto-focusing technologies may hardly obtain the distance information of objects positioned at different locations.

SUMMARY

Example embodiments provide an electronic device configured to reduce light loss of a visible light image and obtain distance information of an object.

According to example embodiments, an electronic device includes a lens, an optical filter asymmetric to an optical axis of the lens, and an image sensor including a visible light image sensor and a non-visible light image sensor. The optical filter has an opening and is configured to transmit visible light and block at least one type of non-visible light. The visible light image sensor is configured to sense the visible light and the non-visible light image sensor is configured to sense at least one type of non-visible light.

The at least one type of non-visible light may be one of infrared light and ultraviolet light.

The visible light image sensor may obtain a visible light image from the visible light passing the optical filter including the opening of the optical filter, the non-visible light image sensor may obtain a non-visible light image from the non-visible light passing the opening of the optical filter, and distance information of an object may be obtained from a position difference between the visible light image and the non-visible light image.

The opening may be at one side of the lens based on the optical axis of the lens.

The opening may be one of circular and polygonal.

The optical filter may be between the lens and the image sensor.

The image sensor may include a plurality of pixels, and a distance between a center of the optical filter and a center of the opening may be larger than a size of one of the plurality of pixels.

The visible light image sensor and the non-visible light image sensor may be stacked.

The non-visible light image sensor may be closer to the optical filter than the visible light image sensor.

The visible light image sensor may include a blue light detecting device configured to one of selectively sense and selectively absorb light in a blue wavelength region, a green light detecting device configured to one of selectively sense and selectively absorb light in a green wavelength region, and a red light detecting device configured to one of selectively sense and selectively absorb light in a red wavelength region.

The blue light detecting device, the green light detecting device and the red light detecting device may be independently one of a photo-sensing device and a photoelectronic device.

At least one of the blue light detecting device, the green light detecting device and the red light detecting device may be the photo-sensing device, and the visible light image sensor may further include a color filter overlapping the photo-sensing device.

At least one of the blue light detecting device, the green light detecting device and the red light detecting device may be the photoelectronic device, and the photoelectronic device may include a pair of electrodes facing each other and a visible light absorption layer between the pair of electrodes and configured to selectively absorb one of the light in the blue wavelength region, the green wavelength region and the red wavelength region.

The non-visible light image sensor may be a non-visible light detecting device configured to one of selectively sense and selectively absorb one of infrared light and ultraviolet light, and the non-visible light detecting device may be one of a photo-sensing device and a photoelectronic device.

The non-visible light detecting device may be the photoelectronic device, and the photoelectronic device may include a pair of electrodes facing each other and a non-visible light absorption layer between the pair of electrodes and configured to selectively absorb the one of infrared light and ultraviolet light.

The non-visible light absorption layer may include at least one organic material.

The image sensor may include a plurality of unit pixel groups repeatedly arranged along a row and a column, and each of the plurality of unit pixel groups may include a non-visible light pixel connected to the non-visible light image sensor, a blue pixel including the blue light detecting device, a green pixel including the green light detecting device, and a red pixel including the green light detecting device.

The non-visible light pixel may be one of an infrared light pixel and an ultraviolet light pixel.

One of the blue pixel, the green pixel, and the red pixel may have a different area from the other of the plurality of pixels.

The green pixel may have a larger area than the blue pixel and the red pixel.

DETAILED DESCRIPTION

Figure 1:
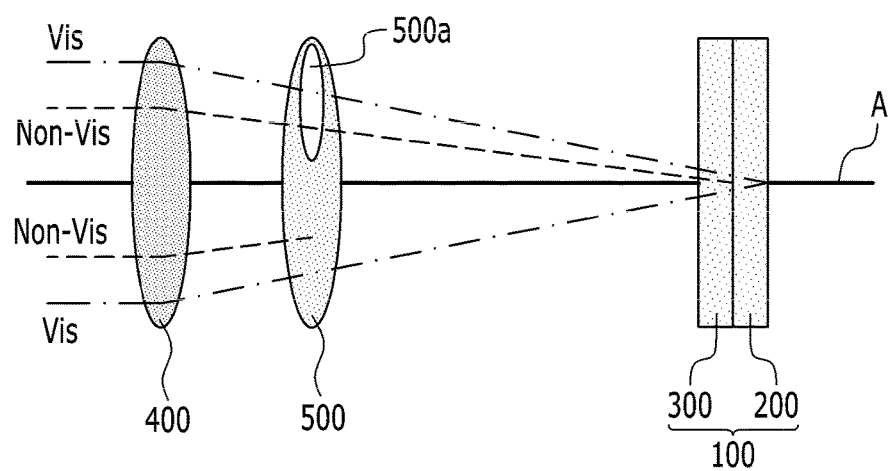
FIG. 1 is a schematic view showing a part of an electronic device according to example embodiments.

Example embodiments of the present inventive concepts will hereinafter be described in detail, and may be more easily performed by those who have common knowledge in the related art. However, this disclosure may be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Hereinafter, an electronic device according to example embodiments is described referring to drawings. The electronic device may be, for example, an image device (e.g., a camera or a camcorder).

Figure 2:
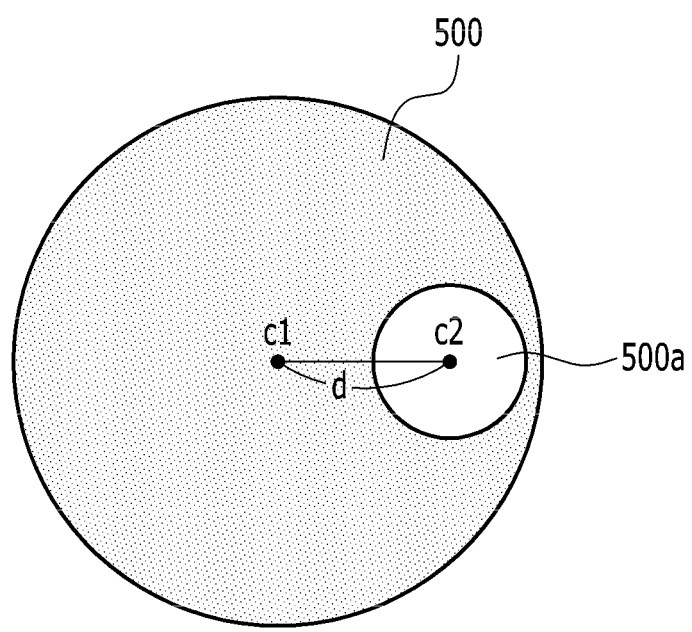
FIG. 2 is a schematic view showing the cross-section of an optical film of the electronic device of FIG. 1.

FIG. 1 is a schematic view showing a part of an electronic device according to example embodiments and FIG. 2 is a schematic view showing a cross-section of an optical film of the electronic device of FIG. 1.

Referring to FIG. 1, an electronic device according to example embodiments includes a lens 400, an optical filter 500 and an image sensor 100.

The lens 400 may be a focusing lens and have no particular limitation, as long as incident light is controlled in terms of a direction and collected.

The optical filter 500 may selectively transmit light depending on a wavelength region, that is, light in a visible ray region (hereinafter, referred to as 'visible light') (Vis) but block at least a part of the other light except for the light in the visible ray region (Non-Vis) (hereinafter, referred to as 'non-visible light'). Herein, the visible light may be light in a wavelength region of about 400 nm to about 700 nm, and the non-visible light may be light in a wavelength region of less than about 400 nm and/or greater than about 700 nm. For example, the non-visible light may be light in an ultraviolet (UV) region of less than about 400 nm (hereinafter, referred to as 'ultraviolet light') or light in an infrared (IR) region of greater than about 700 nm (hereinafter, referred to as 'infrared light').

The optical filter 500 may have, for example, a structure of stacking a plurality of layers having a different refractive index and/or reflectance, and herein, the refractive index, reflectance, thickness, and number of the layers may be respectively set to transmit visible light but to reflect and/or absorb infrared light or visible light.

The optical filter 500 may be, for example, formed of a material selectively absorbing or reflecting the infrared light or ultraviolet light or coated with the material selectively absorbing or reflecting the infrared light or ultraviolet light on a transparent substrate.

The optical filter 500 has an opening 500a.

The opening 500a may be one or greater than or equal to about two and asymmetrically positioned based on the optical axis A of the lens 400. The opening 500a may be positioned at one side of the lens 400 based on the optical axis A as illustrated in FIG. 1, for example. For example, although not illustrated, more than two openings 500a may be asymmetrically positioned based on the optical axis A of the lens 400. For example, the opening 500a may be asymmetrically positioned as a different shape and/or a different size based on the optical axis A of the lens 400.

The opening 500a may be circular or polygonal, but is not limited thereto. The opening 500a has no particular limitation regarding size, but as illustrated in FIG. 2, a distance (d) between the center (c1) of the optical filter 500 and the center (c2) of the opening 500a may be for example larger than the size of one pixel in the image sensor 100. Herein, desirable resolution may be obtained.

The image sensor 100 may be an organic image sensor, an inorganic image sensor, or a combination thereof, for example a silicon image sensor, an organic material image sensor, a quantum dot image sensor, etc.

The image sensor 100 includes a visible light image sensor 200 configured to sense visible light and a non-visible light image sensor 300 configured to sense at least one type of non-visible light. The visible light image sensor 200 and the non-visible light image sensor 300 may be stacked, and herein, the non-visible light image sensor 300 may be positioned closer to the optical filter 500 than the visible light image sensor 200.

The visible light image sensor 200 may include a blue light detecting device configured to selectively sense or absorb light in a blue wavelength region, a green light detecting device configured to selectively sense or absorb light in a green wavelength region and a red light detecting device configured to selectively sense or absorb light in a red wavelength region, and the blue light detecting device, the green light detecting device and the red light detecting device may be independently a photo-sensing device or a photoelectronic device. The photo-sensing device may be, for example a photodiode. The photoelectronic device may include, for example, a pair of electrodes facing each other, and a visible light absorption layer between the pair of electrodes and configured to selectively absorb one of blue, green and red light.

The non-visible light image sensor 300 may be a non-visible light detecting device configured to selectively sense or absorb infrared light or ultraviolet light, and the non-visible light detecting device may be a photo-sensing device or a photoelectronic device. The photo-sensing device may be, for example, a photodiode. The photoelectronic device may include, for example, a pair of electrodes facing each other, and a non-visible light absorption layer configured to selectively absorb infrared light or ultraviolet light.

The visible light image sensor 200 senses visible light and may obtain a visible light image according to sensed information. The non-visible light image sensor 300 senses infrared light or visible light and may obtain a non-visible light image according to sensed information.

Herein, a region passing non-visible light is differentiated from a region passing visible light by using the optical filter 500 having the opening 500a, and thus an image shift between the visible light image and the non-visible light image may occur. In other words, as described above, because the visible light image may be obtained from the visible light passing the optical filter 500 and the opening 500a, while the non-visible light image may be obtained from infrared light or visible light passing only through the opening 500a, the visible light image and the non-visible light image may be imaged in different positions and thus cause the image shift between the visible light image and the non-visible light image. Accordingly, the distance information of an object may be obtained depending on a degree of the image shift.

Figure 3:
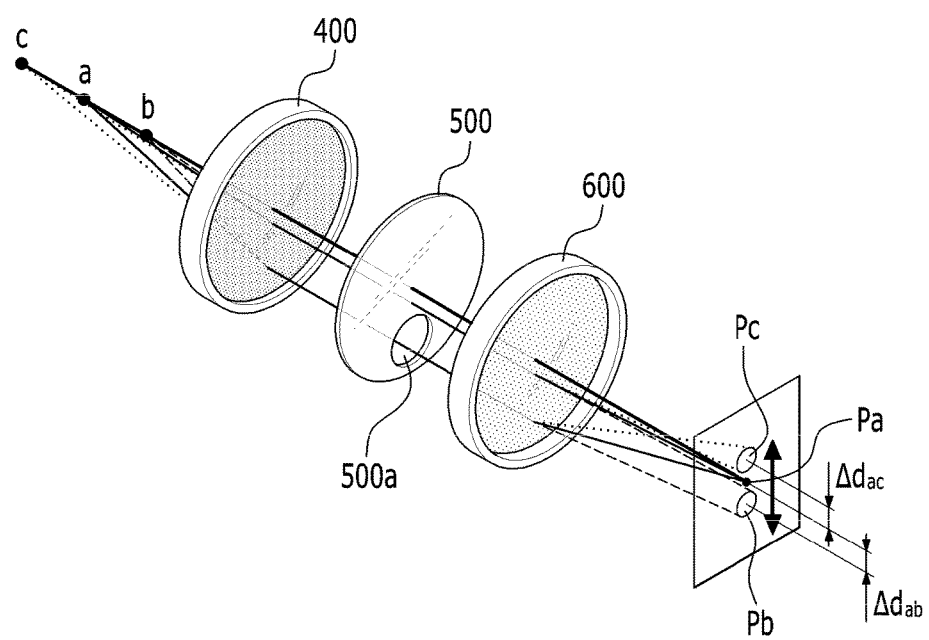
FIG. 3 is a schematic view showing the position of an image depending on an object distance.

FIG. 3 is a schematic view showing the position of an image depending on the distance of an object.

Referring to FIG. 3, when a plurality of objects (a, b, c) is present in different distances from the lens 400, the object (a) present at a point agreeing with the focal distance of the lens 400 may obtain a first image (Pa) from the visible light and the non-visible light passing the lenses 400 and 600 and the optical film 500, while the objects (b and c) closer or farther from the focal distance of the lens 400 may have a second image (Pb) and a third image (Pc) in different positions from the first image Pa. The distance information of the objects (a, b, c) may be predicted by reflecting degree ($\Delta d_{ab}$) of the image shift between the first image (Pa) and the second image (Pb) and degree ($\Delta d_{ac}$) of the image shift between the first image (Pa) and the third image (Pc).

Figure 4:
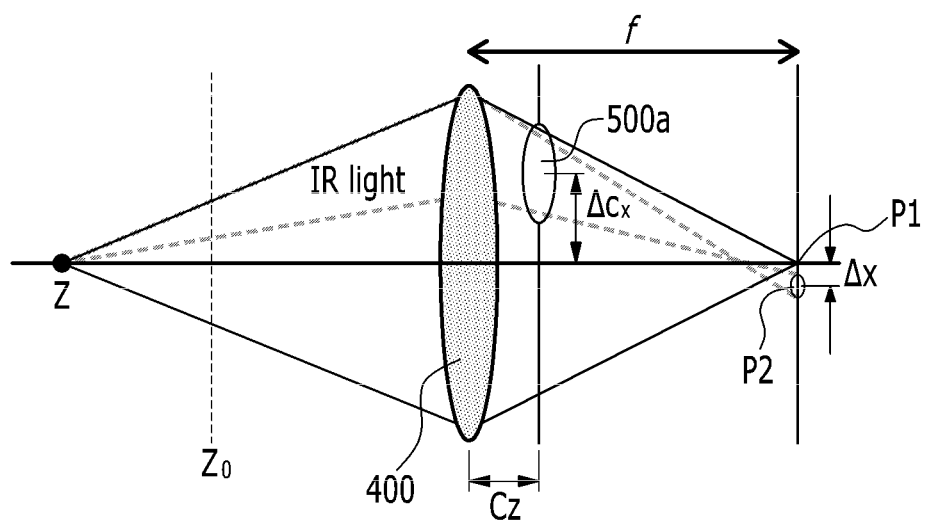
FIG. 4 is a schematic view showing a relationship between an image shift and the object distance in the electronic device of FIG. 1.

FIG. 4 is a schematic view showing a relationship between the image shift and the object distance in the electronic device of FIG. 1.

For example, referring to FIG. 4, the relationship between the image shift and the object distance may be calculated from the following relationship equation.

$$\Delta x \approx f\left(\frac{1}{Z} - \frac{1}{Z_0}\right)\frac{f}{f - c_z}\Delta c_x$$

Herein, $\Delta x$ indicates an image shift, Z indicates an object distance, f indicates a focus length, $Z_0$ indicates plane of focus, $c_z$ indicates a distance between lens and an optical filter, and $\Delta c_x$ indicates a distance from the optical axis of the lens to the opening center of the optical filter.

Figure 5:
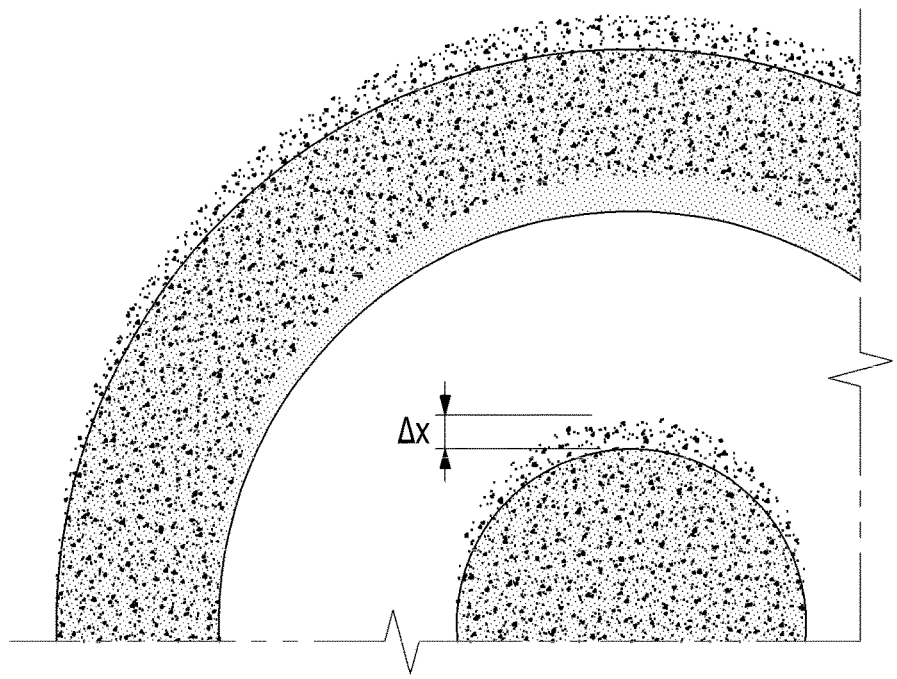
FIG. 5 is an example showing the image shift according to example embodiments.
Figure 6:
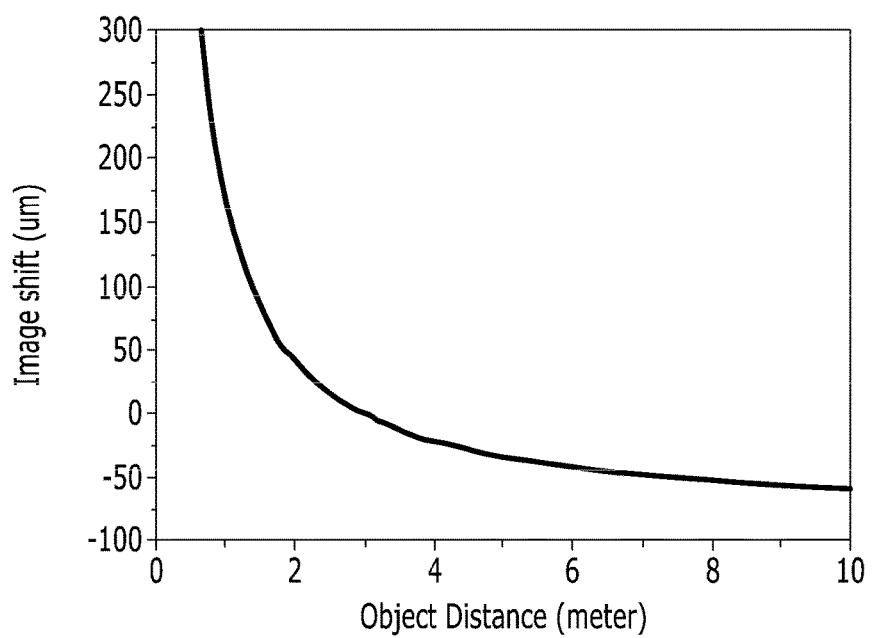
FIG. 6 is a graph showing a relationship between an image shift and the object distance in accordance with example embodiments.

For example, assuming that f=49.8 mm, $Z_0$=3000 mm, $c_z$=−10 mm, and $\Delta c_x$=6 mm, the relation between the image shift and the object distance may be expressed as in FIGS. 5 and 6.

FIG. 5 schematically shows the image shift, and FIG. 6 is a graph showing the relationship between the image shift and the object distance according to example embodiments.

Referring to FIGS. 5 and 6, the object distance may be predicted from the image shift.

In this way, a region passing the non-visible light is differentiated from a region passing the visible light by using the optical filter 500 having the opening 500a. Accordingly, an image shift between the visible light image obtained from the visible light and the non-visible light image obtained from the non-visible light occurs, and an object distance may be obtained therefrom.

Herein, the visible light passes the optical filter 500 and the opening 500a of the optical filter 500 and is sensed in an image sensor with reduced or no light loss and thus may realize a satisfactory visible light image. In other words, the satisfactory visible light image may be obtained with reduced or no light loss by using non-visible light (e.g., infrared light or ultraviolet light) for obtaining a reference image about an object distance.

However, when a part of visible light, for example, red light, blue light, and/or green light, is used to obtain the reference image about an object distance, the reference image may be obtained by using a separate color filter, and herein, the color filter may absorb, reflect, and/or block the visible light and cause loss of the visible light.

Hereinafter, one example of an image sensor 100 is illustrated.

The image sensor according to example embodiments has a pixel array having a matrix format in which a unit pixel group including a plurality of pixels is repeatedly arranged along a row and a column.

The unit pixel group includes at least one pixel sensing visible light (hereinafter, referred to as 'visible light sensing pixel') and a pixel sensing at least one type of non-visible light (hereinafter, referred to as 'non-visible light sensing pixel').

Figure 7:
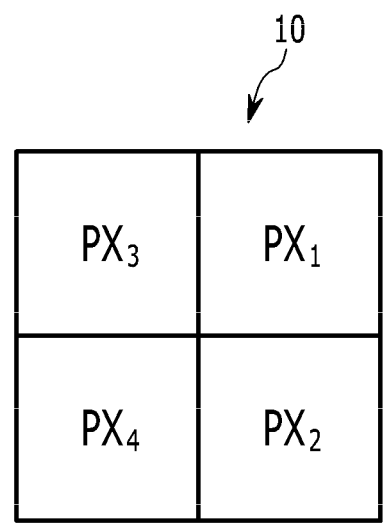
FIG. 7 is a top plan view showing a unit pixel group in an image sensor according to example embodiments.

FIG. 7 is a top plan view showing a unit pixel group of an image sensor according to example embodiments.

Referring to FIG. 7, the unit pixel group 10 of an image sensor according to example embodiments includes a pixel 1 ($PX_1$), a pixel 2 ($PX_2$), a pixel 3 ($PX_3$), and a pixel 4 ($PX_4$) arranged in two rows and two columns (2*2). Three of the four pixels, i.e., the pixel 1 ($PX_1$), the pixel 2 ($PX_2$), the pixel 3 ($PX_3$) and the pixel 4 ($PX_4$), may be visible light sensing pixels to sense three primary colors, and the last one may be a non-visible light sensing pixel sensing at least one type of non-visible light. However, the visible light sensing pixels and the non-visible light sensing pixel may be added or omitted, as needed.

For example, when the pixel 1 ($PX_1$), the pixel 2 ($PX_2$), and the pixel 3 ($PX_3$) are visible light sensing pixels and pixel 4 ($PX_4$) is a non-visible light sensing pixel, pixel 1 ($PX_1$), the pixel 2 ($PX_2$) and pixel 3 ($PX_3$) may detect light having different wavelength regions from each other in the visible ray wavelength region. For example, among the visible light sensing pixels, the pixel 1 ($PX_1$) may be a pixel sensing visible light having a maximum absorption wavelength ($\lambda_{max}$) of about 500 nm to about 580 nm; the pixel 2 ($PX_2$) may be a pixel sensing visible light having a maximum absorption wavelength ($\lambda_{max}$) of greater than or equal to about 400 nm and less than about 500 nm; and the pixel 3 ($PX_3$) may be a pixel sensing visible light having a maximum absorption wavelength ($\lambda_{max}$) of greater than about 580 nm and less than or equal to about 700 nm.

For example, the pixel 1 ($PX_1$) may be a green pixel selectively sensing green light, the pixel 2 ($PX_2$) may be a blue pixel selectively sensing blue light, and the pixel 3 ($PX_3$) may be a red pixel selectively sensing red light. However, it is not limited thereto, and the arrangement and the order of pixels may be changed.

The pixel 4 ($PX_4$), which is a non-visible light sensing pixel, may be a pixel selectively sensing ultraviolet light or infrared light having a maximum absorption wavelength ($\lambda_{max}$) of less than about 400 nm or greater than about 700 nm. The infrared light may have a maximum absorption wavelength ($\lambda_{max}$), for example, from greater than about 700 nm to 3 μm, and within the range, the maximum absorption wavelength ($\lambda_{max}$) may be, for example, from about 800 nm to about 1500 nm.

Figure 8:
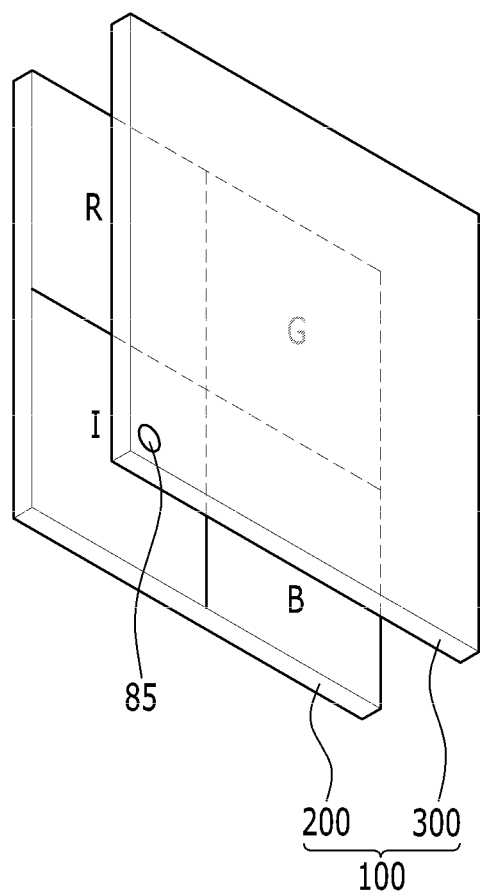
FIG. 8 is a top plan view schematically showing the unit pixel group of the image sensor according to example embodiments.
Figure 9:
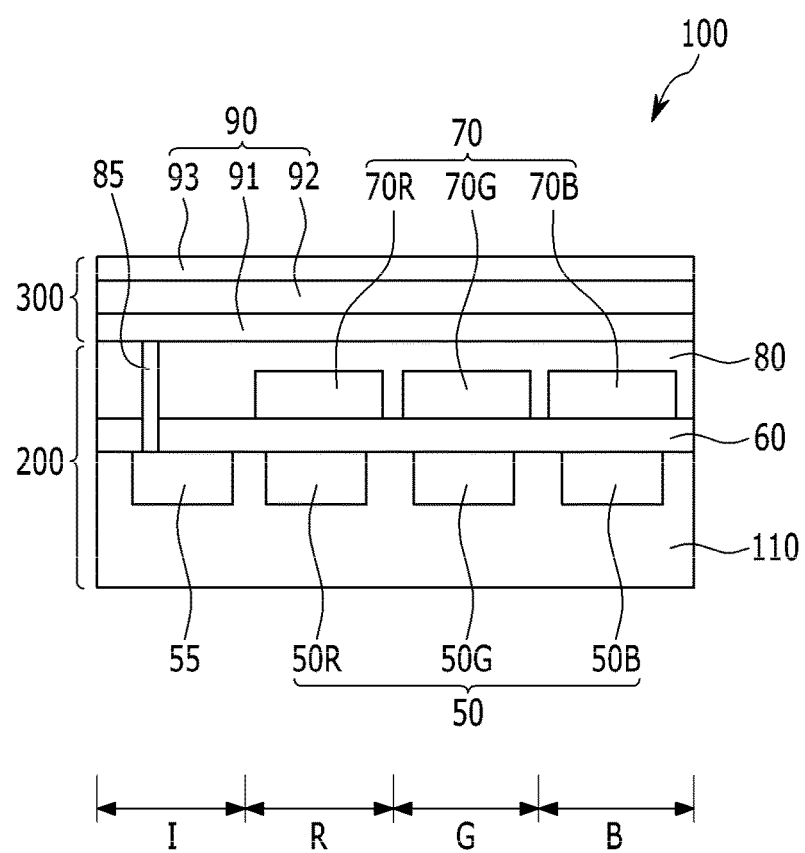
FIG. 9 is a cross-sectional view schematically showing an image sensor of FIG. 8.

FIG. 8 is a top plan view schematically showing a unit pixel group of image sensor according to example embodiments, and FIG. 9 is a cross-sectional view schematically showing an image sensor of FIG. 8.

In FIGS. 8 and 9, for better understanding and ease of description, the visible light-sensing pixels are illustrated as a green pixel (G), a blue pixel (B), and a red pixel (R), and the non-visible light sensing pixel is illustrated as an infrared light sensing pixel (I), without limitation. In addition, the arrangement and the organization of the green pixel (G), blue pixel (B), the red pixel (R) and the infrared light sensing pixel (I) shown in FIGS. 8 and 9 may be variously changed.

Referring to FIGS. 8 and 9, an image sensor 100 according to example embodiments includes a semiconductor substrate 110, a lower insulation layer 60, a color filter layer 70, an upper insulation layer 80, and an infrared light photoelectronic device 90.

The semiconductor substrate 110 may be a silicon substrate, and is integrated with a photo-sensing device 50, a transmission transistor (not shown), and a charge storage device 55. The photo-sensing devices 50 may be, for example, a photodiode.

The photo-sensing device 50, the transmission transistor (not shown), and the charge storage device 55 may be integrated in each pixel, and for example, a green photo-sensing device 50G and a transmission transistor may be integrated in each green pixel (G), a blue photo-sensing device 50B and a transmission transistor may be integrated in each blue pixel (B), a red photo-sensing device 50R and a transmission transistor may be integrated in each red pixel (R), and a charge storage device 55 and a transmission transistor may be integrated in each infrared light sensing pixel (I). The charge storage device 55 is electrically connected with the infrared light photoelectronic device 90 that will be described later.

The green photo-sensing device 50G, the blue photo-sensing device 50B, and the red photo-sensing device 50R may be spaced apart from each other in a horizontal direction.

The photo-sensing device 50 senses light, the information sensed by the photo-sensing device may be transferred by the transmission transistor, the charge storage device 55 is electrically connected with the infrared light photoelectronic device 90, and the information of the charge storage device 55 may be transferred by the transmission transistor.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but are not limited thereto. Further, it is not limited to the structure, and the metal wire and pad may be positioned under the photo-sensing device 50.

The lower insulation layer 60 is formed on the metal wire and the pad. The lower insulation layer 60 may be made of an inorganic insulating material (e.g., a silicon oxide and/or a silicon nitride), or a low dielectric constant (low K) material (e.g., SiC, SiCOH, SiCO, and SiOF). The lower insulation layer 60 has a trench exposing the charge storage device 55. The trench may be filled with fillers. The lower insulation layer 60 may be omitted.

The color filter layer 70 is formed on the lower insulation layer 60. The color filter layer 70 may be formed in the visible light-sensing pixel, and may be formed with a color filter selectively transmitting light having different wavelength regions from each other according to each visible light-sensing pixel in the visible ray wavelength region. For example, the green pixel (G) may be formed with a green filter 70G selectively transmitting green light having a maximum absorption wavelength ($\lambda_{max}$) from about 500 nm to about 580 nm; the blue pixel (B) may be formed with a blue filter 70B selectively transmitting green light having a maximum absorption wavelength ($\lambda_{max}$) of greater than or equal to about 400 nm and less than about 500 nm; and the red pixel (R) may be formed with a red filter 70R selectively transmitting a red light having a maximum absorption wavelength ($\lambda_{max}$) of greater than about 580 nm and less than or equal to about 700 nm.

The green filter 70G selectively transmits light in a green wavelength region and transfers to a green photo-sensing device 50G; the blue filter 70B selectively transmits light in a blue wavelength region and transfers to a blue photo-sensing device 50B; and the red filter 70R selectively transmits light in a red wavelength region and transfers to a red photo-sensing device 50R.

The color filter layer 70 may be omitted.

The upper insulation layer 80 is formed on the color filter 70. The upper insulation layer 80 may eliminate a step caused by the color filter layer 70 and smoothes the surface. The upper insulation layer 80 and the lower insulation layer 60 may include a contact hole (not shown) exposing a pad, and a through-hole 85 exposing the charge storage device 55.

The infrared light photoelectronic device 90 is formed on the upper insulation layer 80.

The infrared light photoelectronic device 90 includes a pixel electrode 91, an infrared light absorption layer 92 and a common electrode 93.

Either the pixel electrode 91 or the common electrode 93 is an anode, and the other is a cathode. For example, the pixel electrode 91 may be an anode, and the common electrode 93 may be a cathode.

Both the pixel electrode 91 and the common electrode 93 may be light-transmitting electrodes or semi light-transmitting electrodes. The light-transmitting electrode or the semi light-transmitting electrode may be made of, for example, a transparent conductor (e.g., indium tin oxide (ITO) or indium zinc oxide (IZO)), or may be a metal thin layer having a relatively thin thickness of several nanometers or several tens of nanometers or a metal thin layer having a relatively thin thickness of several nanometers to several tens of nanometers doped with a metal oxide.

The infrared light absorption layer 92 selectively absorbs light in an infrared region, for example, at least one of a near-infrared region, a mid-infrared region and a far-infrared region.

The infrared light absorption layer 92 may selectively absorb light having a maximum absorption wavelength ($\lambda_{max}$) of, for example, greater than about 700 nm, within the range, it may selectively absorb light having a maximum absorption wavelength ($\lambda_{max}$) of, for example, greater than about 700 nm to about 3 µm; and within the range, it may selectively absorb light having a maximum absorption wavelength ($\lambda_{max}$) of, for example, about 800 nm to about 1500 nm. The light in other regions besides the infrared ray wavelength region may be passed through the infrared light absorption layer 92 as it is.

The infrared light absorption layer 92 may include, for example, a p-type semiconductor and an n-type semiconductor, and the p-type semiconductor and the n-type semiconductor may form a pn junction. At least one of the p-type semiconductor and the n-type semiconductor may selectively absorb light in an infrared region, and may selectively absorb light in an infrared ray wavelength region to generate excitons, and then the generated excitons may be separated into holes and electrons to provide a photoelectronic effect.

The p-type semiconductor and the n-type semiconductor may include at least one organic material. The organic material may be any material that selectively absorbs light in an infrared region without particular limitation, and at least one of the p-type semiconductor and the n-type semiconductor may include, for example, a quinoid metal complex compound, a cyanine compound, an ammonium compound, a diammonium compound, a triarylmethane compound, a dipyrromethene compound, a diquinone compound, a naphthoquinone compound, an anthraquinone compound, a squarylium compound, a rylium compound, a ryleme compound, a phthalocyanine compound, a naphthalocyanine compound, a perylene compound, a squaraine compound, a boron dipyrromethene compound, a nickel-dithiol complex compound, merocyanine, diketopyrrolopyrrole, a derivative thereof, or a combination thereof, but is not limited thereto. For example, the p-type semiconductor may be merocyanine, diketopyrrolopyrrole, a boron dipyrromethene compound, a naphthalocyanine compound, a squaraine compound, a derivative thereof, or a combination thereof, and the n-type semiconductor may be C60, C70, thiophene, a derivative thereof, or a combination thereof, but is not limited thereto.

The infrared light absorption layer 92 may be a single layer or a multilayer. The infrared light absorption layer 92 may be, for example an intrinsic layer (I layer), a p-type layer/I layer, an I layer/n-type layer, a p-type layer/I layer/n-type layer, a p-type layer/n-type layer, etc.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The infrared light absorption layer 92 may have a thickness of about 1 nm to about 500 nm, and specifically, about 5 nm to about 300 nm. Within the thickness range, the infrared light absorption layer 92 may effectively absorb light in an infrared region, effectively separate holes from electrons, and deliver them, thereby effectively improving photoelectronic conversion efficiency.

The infrared light absorption layer 92 may be formed on the whole surface of the image sensor 100. Thereby, as the infrared light may be absorbed on the whole surface of the image sensor, the light area may be increased to provide relatively high light-absorptive efficiency.

The pixel electrode 91, the infrared ray absorption layer 92 and the common electrode 93 form an infrared light photoelectronic device 90. In other words, when light enters from the common electrode 93, and then light in the infrared ray wavelength region is selectively absorbed by the infrared light absorption layer 92, excitons may be generated in the infrared light absorption layer 92. The excitons are separated into holes and electrons, the separated holes are transferred to an anode side, which is one of the pixel electrode 91 and the common electrode 93, and the separated electrons are transferred into a cathode side, which is one of the pixel electrode 91 and the common electrode 93, so as to flow a current. The separated electrons or holes may be gathered to the charge storage device 55.

A focusing lens (not shown) may be further formed on the common electrode 93. The focusing lens may control a direction of incident light and gather the light in one region.

By disposing the infrared ray absorption layer 92 on the visible light sensing pixel, light in the infrared region flowing into the visible light-sensing pixel may be preliminarily blocked, so the image sensor 100 does not require an additional infrared ray filter (IR filter).

The structure and the process of the image sensor 100 may be simplified since the infrared light-sensing pixel is separated from the visible light-sensing pixel, so the infrared light signal transmission structure between the infrared light photoelectronic device 90 and the charge storage device 55 does not penetrate through the visible light-sensing pixel. When a signal transmission structure of the infrared light is positioned in the visible light-sensing pixel, the color filter area may be reduced to provide an area of the signal transmission structure, so the aperture ratio of each pixel may be decreased, and the process may be complicated. But according to example embodiments, by separately providing an infrared-sensing pixel, the aperture ratio of the visible light-sensing pixel may be sufficiently ensured, and the process may be simplified.

In example embodiments, the image sensor 100 including the visible light image sensor 200, for example, a photo-sensing device, and the non-visible light image sensor 300, for example, a photoelectronic device, are disclosed. However, the visible light image sensor 200 may include a photo-sensing device, a photoelectronic device or a combination thereof, and the non-visible light image sensor 300 may include a photo-sensing device or a photoelectronic device.

Figure 10:
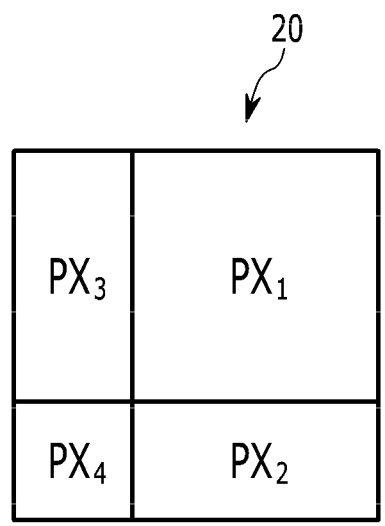
FIG. 10 is a top plan view showing a unit pixel group of an image sensor according to example embodiments.

FIG. 10 is a top plan view showing a unit pixel group of an image sensor according to example embodiments.

Referring to FIG. 10, the unit pixel group 20 of image sensor according to example embodiments includes pixel 1 (PX$_1$), pixel 2 (PX$_2$), pixel 3 (PX$_3$), and pixel 4 (PX$_4$) which are arranged along two rows and two columns.

However, in the unit pixel group 20 of the image sensor according to example embodiments, at least one of the pixels, i.e., pixel 1 (PX$_1$), pixel 2 (PX$_2$), pixel 3 (PX$_3$), and pixel 4 (PX$_4$), may have a different area from the others, unlike the example embodiment illustrated in FIG. 7. Each pixel area of the unit pixel group 20 may be variously changed as needed.

For example, the pixel 1 (PX$_1$) may have the larger area than the pixel 2 (PX$_2$), pixel 3 (PX$_3$), and pixel 4 (PX$_4$) as illustrated in FIG. 10.

Furthermore, the pixel 2 (PX$_2$) and the pixel 3 (PX$_3$) may have the same area.

Although not shown, the pixel 1 (PX$_1$) may have the largest area, and the pixel 2 (PX$_2$), pixel 3 (PX$_3$), and pixel 4 (PX$_4$) may have the same area.

For example, in FIG. 10, the pixel 1 (PX$_1$) may have the largest area, the pixel 2 (PX$_2$) and the pixel 3 (PX$_3$) may have the same area, and the pixel 4 (PX$_4$) may have the smallest area.

Although not shown, the pixel 1 (PX$_1$) may have the largest area, the pixel 2 (PX$_2$) and the pixel 3 (PX$_3$) may have the smallest area, and the pixel 4 (PX$_4$) may have an area that is smaller than the area of the pixel 1 (PX$_1$) and larger than the area of the pixel 2 (PX$_2$) or the area of the pixel 3 (PX$_3$).

For example, the pixel 1 (PX$_1$) may be a green pixel (G), the pixel 2 (PX$_2$) may be a blue pixel (B), the pixel 3 (PX$_3$) may be a red pixel (R), and the pixel 4 (PX$_4$) may be a visible light-sensing pixel (I).

For example, the green pixel (G) may have the larger area than the area of the red pixel (R), the blue pixel (B), and the infrared light-sensing pixel (I).

For example, the red pixel (R) and the blue pixel (B) may have the same area.

For example, the green pixel (G) may have the largest area, and the red pixel (R), the blue pixel (B), and the infrared light-sensing pixel (I) may have the same area.

For example, the green pixel (G) may have the largest area, the red pixel (R) and the blue pixel (B) may have the same area, and the infrared light-sensing pixel (I) may have the smallest area.

For example, the green pixel (G) may have the largest area, the red pixel (R) and the blue pixel (B) may have the smallest area, and the infrared light-sensing pixel (I) may have an area that is smaller than the area of the green pixel (G) and larger than the area of the red pixel (R) or the area of the blue pixel (B).

As in the above, by providing each pixel of the unit pixel group 20 with the different area, even if the area of the visible light-sensing pixel is decreased due to the infrared light-sensing pixel (I), the visible light-sensing efficiency may be reduced or prevented from being decreased, and the relatively high resolution image sensor may be accomplished by adjusting the visible light-sensing pixel ratio.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. Au electronic device comprising:
a lens;
an optical filter having an opening and configured to transmit visible light and block at least one type of non-visible light, wherein the opening is asymmetric to an optical axis of the lens;
an image sensor including a visible light image sensor and a non-visible light image sensor, the visible light image sensor configured to sense the visible light and the non-visible light image sensor configured to sense the at least one type of non-visible light;
wherein the visible light image sensor comprises:
a blue light detecting device configured to one of selectively sense and selectively absorb light in a blue wavelength region;
a green light detecting device configured to one of selectively sense and selectively absorb light, in a green wavelength region; and a red light detecting device configured to one of selectively sense and selectively absorb light in a red wavelength region.

2. The electronic device of claim 1, wherein the at least one type of non-visible light is one of infrared light and ultraviolet light.

3. The electronic device of claim 1, wherein the visible light image sensor obtains a visible light image from the visible light passing the optical filter including the opening;
the non-visible light image sensor obtains a non-visible light image from the non-visible light passing the opening of the optical filter; and
distance information of an object is obtained from a position difference between the visible light image and the non-visible light image.

4. The electronic device of claim 1, wherein the opening is at one side of the lens based on the optical axis of the lens.

5. The electronic device of claim 1, wherein the opening is one of circular and polygonal.

6. The electronic device of claim 1, wherein the optical filter is between the lens and the image sensor.

7. The electronic device of claim 1, wherein
the image sensor includes a plurality of pixels; and
a distance between a center of the optical filter and a center of the opening is larger than a size of one of the plurality of pixels.

8. The electronic device of claim 1, wherein the visible light image sensor and the non-visible light image sensor are stacked.

9. The electronic device of claim 8, wherein the non-visible light image sensor is closer to the optical filter than the visible light image sensor.

10. The electronic device of claim 1, wherein the blue light detecting device, the green light detecting device and the red light detecting device are independently one of a photo-sensing device and a photoelectronic device.

11. The electronic device of claim 10, wherein
at least one of the blue light detecting device, the green light detecting device and the red light detecting device is the photo-sensing device; and
the visible light image sensor further comprises a color filter overlapping the photo-sensing device.

12. The electronic device of claim 10, wherein
at least one of the blue light detecting device, the green light detecting device, and the red light detecting device is the photoelectronic device; and
the photoelectronic device includes,
a pair of electrodes facing each other, and
a visible light absorption layer between the pair of electrodes, the visible light absorption layer configured to selectively absorb one of the light in the blue wavelength region, the green wavelength region, and the red wavelength region.

13. The electronic device of claim 1, wherein
the non-visible light image sensor is a non-visible light detecting device configured to one of selectively sense and selectively absorb one of infrared light and ultraviolet light; and
the non-visible light detecting device is one of a photo-sensing device and a photoelectronic device.

14. An electronic device comprising:
a lens;
an optical filter having an opening and configured to transmit visible light and block at least one type of non-visible light, wherein the opening is asymmetric to an optical axis of the lens; and
an image sensor including a visible light image sensor and a non-visible light image sensor, the visible light image sensor configured to sense the visible light and the non-visible light image sensor configured to sense the at least one type of non-visible light;
wherein
the non-visible light image sensor is a non-visible light detecting device configured to one of selectively sense and selectively absorb one of infrared light and ultraviolet light; and
the non-visible light detecting device is one of a photo-sensing device and a photoelectronic device;
the non-visible light detecting device is the photoelectronic device; and
the photoelectronic device includes,
a pair of electrodes facing each other, and
a non-visible light absorption layer between the pair of electrodes, the non-visible light absorption layer configured to selectively absorb the one of infrared light and ultraviolet light.

15. The electronic device of claim 14, wherein the non-visible light absorption layer includes at least one organic material.

16. The electronic device of claim 1, wherein
the image sensor includes a plurality of unit pixel groups repeatedly arranged along a row and a column; and
each of the plurality of unit pixel groups includes,
a non-visible light pixel connected to the non-visible light image sensor, and
a plurality of pixels including,
a blue pixel including the blue light detecting device,
a green pixel including the green light detecting device, and
a red pixel including the red light detecting device.

17. The electronic device of claim 16, wherein the non-visible light pixel is one of an infrared light pixel and an ultraviolet light pixel.

18. The electronic device of claim 16, wherein one of the blue pixel, the green pixel, and the red pixel has a different area from the other of the plurality of pixels.

19. The electronic device of claim 18, wherein the green pixel has a larger area than the blue pixel and the red pixel.

* * * * *